(12) United States Patent
Boesser et al.

(10) Patent No.: US 7,961,334 B2
(45) Date of Patent: Jun. 14, 2011

(54) COORDINATE MEASURING MACHINE FOR MEASURING STRUCTURES ON A SUBSTRATE

(75) Inventors: Hans-Artur Boesser, Breidenbach (DE); Michael Heiden, Woelfersheim (DE); Klaus-Dieter Adam, Jena (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 345 days.

(21) Appl. No.: 12/220,808

(22) Filed: Jul. 29, 2008

(65) Prior Publication Data

US 2009/0031572 A1    Feb. 5, 2009

(30) Foreign Application Priority Data

Aug. 3, 2007 (DE) .................... 10 2007 036 814

(51) Int. Cl.
*G01B 11/02* (2006.01)
(52) U.S. Cl. ....................................................... 356/500
(58) Field of Classification Search .................. 356/500, 356/511
See application file for complete search history.

(56) References Cited

U.S. PATENT DOCUMENTS

| | | | | |
|---|---|---|---|---|
| 5,293,216 A * | 3/1994 | Moslehi | .................. | 356/600 |
| 5,469,269 A | 11/1995 | Yun | | |
| 5,552,888 A * | 9/1996 | Sogard et al. | .................. | 356/500 |
| 5,610,102 A * | 3/1997 | Gardopee et al. | .................. | 438/5 |
| 6,377,870 B1 | 4/2002 | Blaesing-Bangert | | |
| 6,693,708 B1 * | 2/2004 | Hunter | .................. | 356/237.5 |
| 6,707,544 B1 * | 3/2004 | Hunter et al. | .................. | 356/237.5 |
| 6,721,045 B1 * | 4/2004 | Hunter | .................. | 356/237.5 |
| 2002/0011835 A1 * | 1/2002 | Yamazaki | .................. | 324/158.1 |
| 2003/0151002 A1 * | 8/2003 | Ito et al. | .................. | 250/492.1 |
| 2005/0046845 A1 * | 3/2005 | Nijmeijer et al. | .................. | 356/400 |
| 2006/0262306 A1 * | 11/2006 | Dobschal et al. | .................. | 356/337 |

FOREIGN PATENT DOCUMENTS

| | | |
|---|---|---|
| DE | 19628969 | 10/1997 |
| DE | 10335982 | 3/2005 |

OTHER PUBLICATIONS

"Pattern Placement Metrology for Mask Making" Dr. Carola Blasing Leic Microsystems AG Semicon Education Program, Geneva, Mar. 31, 1998.

* cited by examiner

*Primary Examiner* — Patrick J Connolly
(74) *Attorney, Agent, or Firm* — Simpson & Simpson, PLLC

(57) ABSTRACT

A coordinate measuring machine (1) for measuring structures (3) on a substrate (2) including a measurement table (20) movable in the X-coordinate direction and in the Y-coordinate direction, a measurement objective (9), at least one laser interferometer (24) for determining the position of the measurement table (20) and the measurement objective (9) wherein the measurement table (20), the measurement objective (9) and the at least one laser interferometer (24) are arranged in a vacuum chamber (50).

5 Claims, 4 Drawing Sheets

COORDINATE MEASURING MACHINE FOR MEASURING STRUCTURES ON A SUBSTRATE

CROSS REFERENCE TO RELATED APPLICATIONS

This patent application claims priority of German Patent Application No. 10 2007 036 814.5, filed on Aug. 3, 2007, the application is incorporated herein by reference.

FIELD OF THE INVENTION

The present invention relates to a coordinate measuring machine for measuring structures on a substrate. In particular, the invention relates to a coordinate measuring machine including a movable measurement table, a measurement objective, at least one laser interferometer for determining the position of the measurement table, and a measurement objective.

BACKGROUND OF THE INVENTION

A measuring device for measuring structures on wafers or on a substrate (mask for producing semiconductors) is disclosed in the lecture script "Pattern Placement Metrology for Mask Making" by Dr. Carola Bläsing. The lecture was given on the occasion of the Semicon conference, Education Program, in Geneva on Mar. 31, 1998. The description therein discloses a coordinate measuring device, the measuring method and the basic structure of the coordinate measuring device including accessories. The coordinate measuring device is arranged in a climatic chamber to provide the same climatic conditions with respect to temperature and humidity for the measurement within the climatic chamber.

German Patent DE 196 28 969 also discloses a coordinate measuring device including a two-beam interferometer for determining the position of a measurement table. The two-beam interferometer has an effectively reduced influence of the wavelength changes on the wavelength measurement. This is achieved by inserting a light-transmitting, closed, incompressible body into the optical reference path or the optical measurement path so that, with the movable measurement mirror in a particular position, the portions of the optical reference path and the optical measurement path located outside the body have the same length.

German published application DE 199 49 005 discloses a means and a method for introducing various transparent substrates into a high-precision measuring device. The high-precision measuring device and the additional elements for transporting the transparent substrates, which are associated with the high-precision measuring device, are arranged in a climatic chamber. The climatic chamber thus allows reducing the influence of pressure, humidity and temperature considering the ambient conditions. U.S. Pat. No. 5,469,269 particularly discusses the influence of fast, random air movements, such as they occur after opening or closing doors or after movements in the vicinity of the measuring device. The localized air pressure variations caused thereby result in local changes of the refractive index and thus wavelength changes in the light beam. It is suggested to solve the problem by casing the optical measurement and reference paths in tubes that are open at both ends. Air with a defined temperature stabilization or temperature-stabilized gas is to be blown into the tubes. Tubes with a telescope-like extension mechanism are provided for the optical measurement path, which is variable in length. By casing most of the light beam, the influence of fast air pressure variations is mostly prevented.

SUMMARY OF THE INVENTION

It is the object of the invention to provide a device allowing the measurement of the table position with the interferometer independent of variations of the ambient conditions, such as temperature, humidity and particularly air pressure.

It is a further object of the present invention to design a device such that, when using wavelengths of <248 nanometers, there is no contamination of the substrates by hydrocarbons occurring due to cracking products being deposited on the measurement objective or on the substrate when using such short wavelengths.

This object is achieved by a coordinate measuring machine for the positions measuring of structures on a substrate. The coordinate measuring machine has measurement table which is movable in the X-coordinate direction and in the Y-coordinate direction, a measurement objective, at least one laser interferometer for determining the position of the measurement table and/or the measurement objective and an illumination condenser for the transmitted light illumination of the substrate. The measurement table, the measurement objective, the at least one laser interferometer and the illumination condenser are partially arranged in a vacuum chamber. The vacuum chamber is provided with at least one window which is transparent for the respective illumination or measurement wavelength.

For achieving the above object, it is particularly advantageous if at least the measurement table, the measurement objective and the at least one laser interferometer are arranged in a vacuum chamber.

There may also be provided an illumination condenser for the transmitted light illumination of the substrate, so that measurements may be conducted in incident light and/or transmitted light with the coordinate measuring machine. In this case, the illumination condenser is at least partially arranged in the vacuum chamber. The vacuum chamber is provided with at least one window transparent for the respective measurement wavelength used. The corresponding light or measurement light may thus be supplied to the vacuum chamber in that way.

For the introduction of substrates into the vacuum chamber, the vacuum chamber is provided with a lock.

A transparent window for the illumination or measurement wavelength may be associated with each of the measurement objective, the laser interferometer and the illumination condenser. It is contemplated that the transparent windows may be exchanged depending on the illumination or measurement wavelength currently used or that they are arranged to be exchangeable.

Both the vacuum chamber and the lock are connected to a vacuum system having a vacuum pump so that the appropriate vacuum or fore-vacuum may be generated.

The coordinate measuring machine may be designed such that the measurement objective is opposite the surface of the substrate carrying the structures, and that the normal vector of the surface of the substrate with the structures is parallel to gravity. This is called an inverse arrangement. The inverse arrangement has the advantage that the substrate in the coordinate measuring machine is arranged in exactly the same way as when the substrate is used in a stepper for exposing structures on a wafer. The other arrangement of the substrate is that used in the previous coordinate measuring machines.

There the normal vector of the surface of the substrate with the structures is directed oppositely with respect to gravity.

BRIEF DESCRIPTION OF THE DRAWINGS

In the following, embodiments will explain the invention and its advantages in more detail with reference to the accompanying drawings, in which.

DETAILED DESCRIPTION OF THE INVENTION

Figure 1:
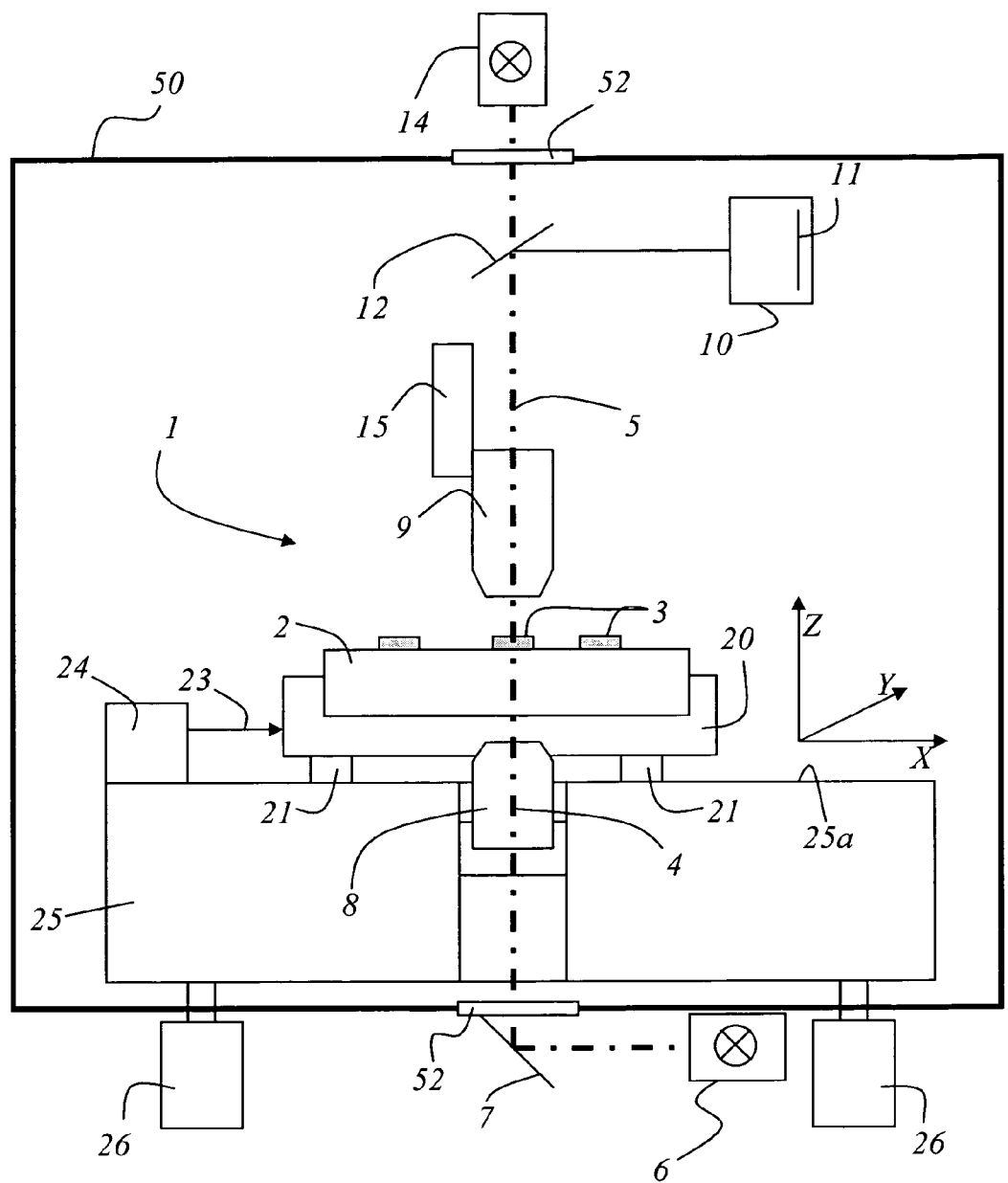
FIG. 1 schematically shows a prior art coordinate measuring device, wherein the whole coordinate measuring device is arranged in a vacuum chamber.

Although a coordinate measuring device of the type shown in FIG. 1 is known from prior art, the schematic structure of coordinate measuring device 1 will be described here for the sake of completeness. According to an embodiment of the invention, the whole coordinate measuring device 1 is provided in housing 50. Housing 50 is designed as a vacuum chamber. Although this is not shown in the illustration of FIG. 1, housing 50 is connected to a system for generating a vacuum. The electronics with which the data of the substrate or the structures on the substrate acquired by camera 10 may be evaluated and digitized may also be arranged outside the housing. Camera 10 may include detector 11, which in a preferred embodiment is connected to a computer which generates a digital image from the signals from the camera.

Coordinate measuring device 1 serves for measuring structures 3 applied to substrate 2. Substrate 2 is deposited on or in measurement table 20 arranged to be translatable in the X-coordinate direction and in the Y-coordinate direction on plane 25a. Various ways of bearing the measurement table are possible. One possible type of bearing consists of air bearings. The translation of measurement table 20 is realized by means of bearings 21 within plane 25a created by the X-coordinate direction and the Y-coordinate direction. If air bearings are used, these air bearings are suitable for the use in a vacuum. Plane 25a is formed by element 25. In one embodiment, element 25, which forms plane 25a may be a granite block. In the shown preferred embodiment, granite block 25 is positioned on vibration dampers 26. The position of measurement table 20 within plane 25a is measured by at least one laser interferometer 24 by means of light beam 23. It is also possible to determine the position of measurement objective 9 by means of a laser interferometer (not shown).

Coordinate measuring machine 1 may be provided with transmitted light illumination means 6. Path of light 4 of transmitted light illumination means 6 reaches substrate 2 via deflecting mirror 7 and condenser 8. There is also provided incident light illumination means 14 directing the light to substrate 2 via measurement objective 9. Beam splitting mirror 12 enables light from incident illumination means 14 to follow path of light 5 and pass through beam splitting mirror 12, but deflects light to camera 10 for monitoring substrate 2. Measurement objective 9 is arranged to be translatable in the Z-coordinate direction or in the direction of optical axis 5 by means of adjusting unit 15. Displacing means 15 thus allows focusing the measurement objective on structures 3 on the substrate. It is recommended to arrange all elements generating a large amount of heat outside housing 50 or the vacuum chamber. In the present case, it is necessary to provide mainly incident light illumination means 14, transmitted light illumination means 6 and the computer (not shown) outside housing 50. In order to permit the light coming from incident light illumination means 14 and/or transmitted light illumination means 6 to get inside housing 50, housing 50 is provided with windows 52. Windows 52 are designed such that they are transparent for the respective wavelengths used for the measurement.

Figure 2:
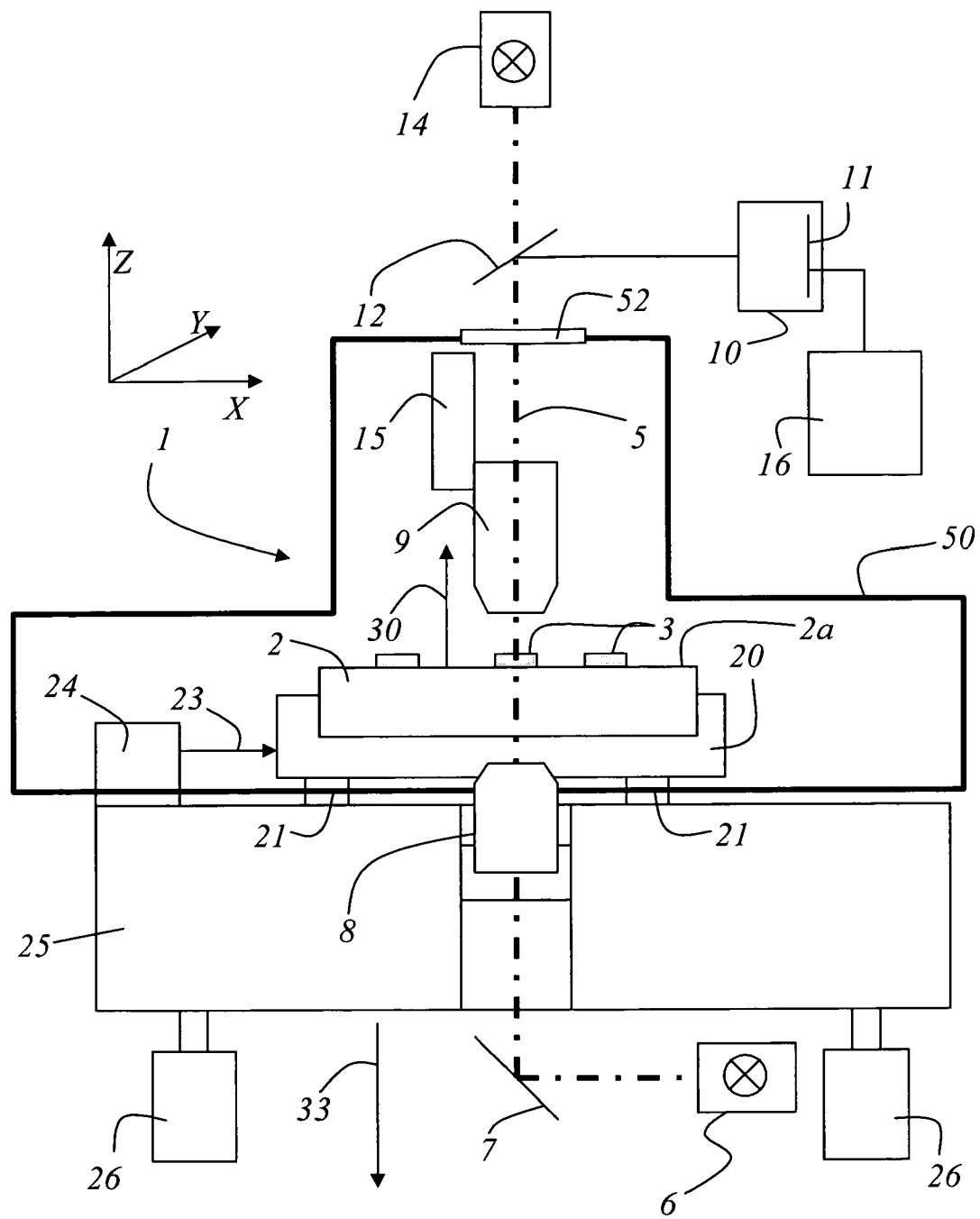
FIG. 2 shows an embodiment of the arrangement of the vacuum chamber with respect to the essential components of a coordinate measuring machine.

FIG. 2 shows another arrangement of housing 50 or the vacuum chamber. The vacuum chamber is designed such that it substantially encloses measurement table 20, laser interferometer 24 and measurement objective 9. Housing 50 is also provided with a transparent window for the illumination light coming from incident light illumination source 14. Housing 50 is designed such that at least part of illumination condenser 8 is enclosed by housing 50.

Figure 3:
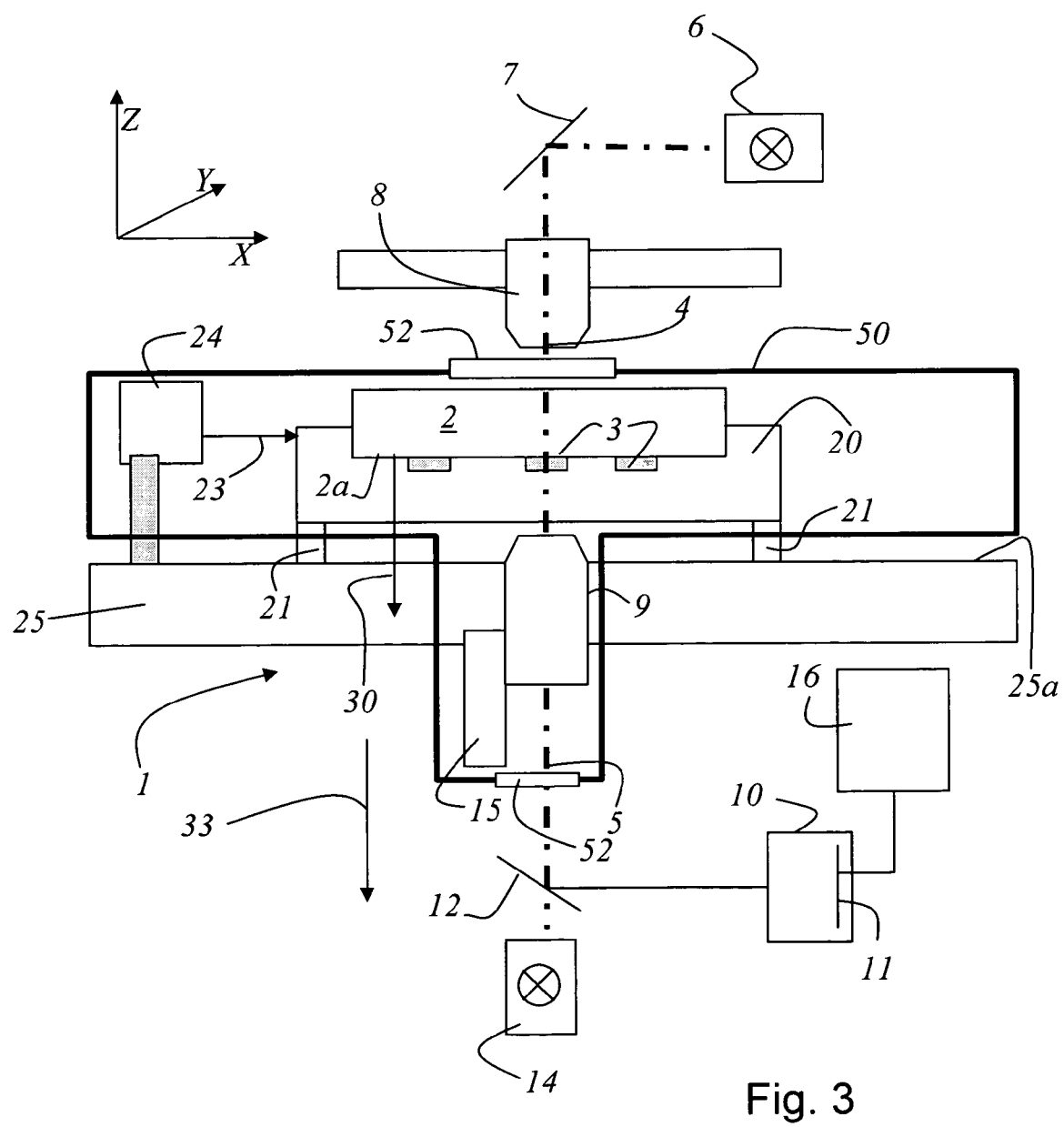
FIG. 3 shows an arrangement of the vacuum chamber in an inversely arranged coordinate measuring machine.

FIG. 3 shows a further embodiment of the arrangement of coordinate measuring machine 1. The substrate 2 is inserted into the coordinate measuring machine such that normal 30 of surface 2a of the substrate is parallel to the direction designated by arrow 33. In the preferred embodiment, the direction of arrow 33 points in the direction of the weight of substrate 2. In other words, arrow 33 points in the direction of gravity. As shown in FIG. 2, normal 30 may alternatively be arranged so that the normal is directed anti-parallel to the direction of arrow 33. By anti-parallel we mean parallel to, but pointing or acting in the opposite direction. Alternatively stated, there is a 180 degree rotation between the two different directions. The first arrangement, in which the normal and gravity are aligned in the same direction, also called inverse arrangement, is advantageous, because when the positions of structures 3 on the substrate are measured by coordinate measuring machine 1, there are the same conditions as when mask 2 is located in a stepper. In a stepper, the mask, or substrate, is imaged onto the surface of a wafer, demagnified by means of projection. As in the arrangement described in FIGS. 1 and 2, housing 50 encloses measurement table 20 with substrate 2, interferometer 24 and measurement objective 9. As mentioned above, the devices of the coordinate measuring means, such as incident light illumination means 14, transmitted light illumination means 6 and computer system 16, are arranged outside housing 50. In order to let the light of incident light illumination means 14 and transmitted light illumination means 6 into the interior of housing 50, transparent windows 52 are provided.

Figure 4:
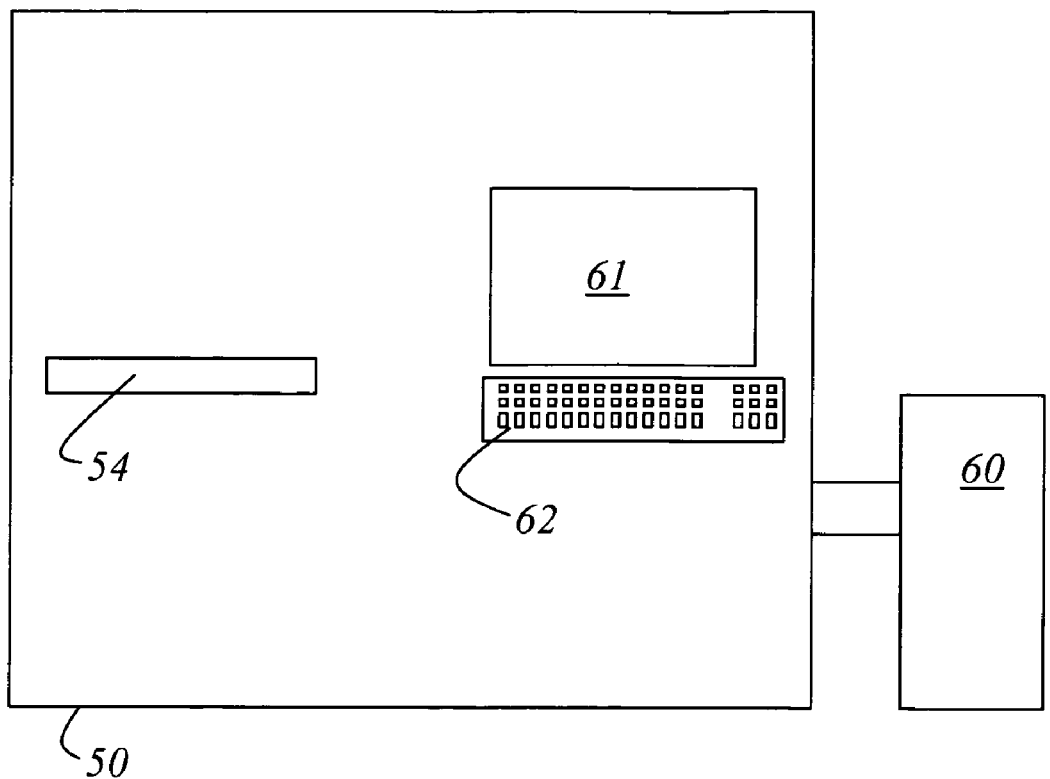
FIG. 4 shows a schematic arrangement of the vacuum chamber in connection with a means for generating a vacuum.

FIG. 4 shows a schematic view of housing 50 for coordinate measuring machine 1 arranged within the housing. Housing 50, in which the vacuum is to be generated, is connected to system 60 with which the corresponding vacuum may be generated, by a vacuum pump, for example. The housing may further be provided with display 61 via which a user may obtain information regarding the measurement being conducted in the interior of housing 50. There is also provided input unit 62, such as a computer keyboard, via which the user may input specific measurement recipes and via which the user may also control the system for generating a vacuum. Housing 50 further has at least one loading aperture 54 via which substrates may be transferred into the interior of housing 50. Obviously, this loading aperture or lock must be designed to be closable so that the vacuum inside housing 50 is maintained so that a contamination of the vacuum may be avoided.

Figure 5:
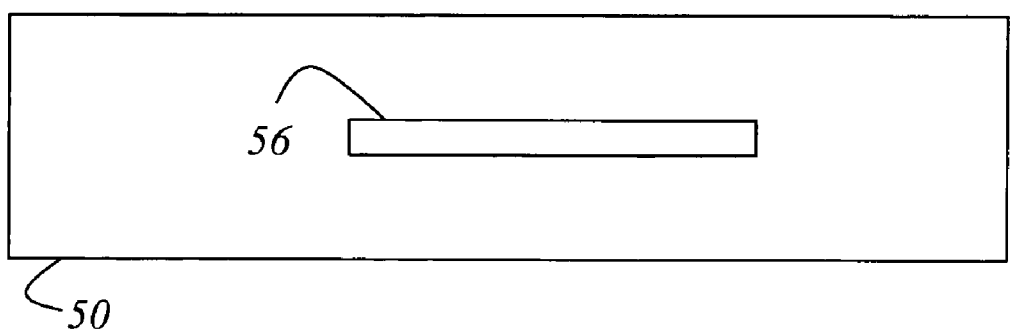
FIG. 5 shows a schematic arrangement of the vacuum chamber provided with a lock via which the substrates to be measured may be introduced into the chamber.

FIG. 5 shows a schematic representation of housing 50 provided with lock 56. Housing 50 schematically shown in FIG. 5 is designed such that it substantially encloses only measurement objective 9, measurement table 20 and interferometer 24 for determining the position of the measurement table and/or the measurement objective. The connection of the housing to a system for generating the vacuum is not shown, because it is obvious to one skilled in the art. The lock is necessary to transfer substrates 2 into the interior of housing 50. As mentioned above, measurement table 20 with substrate 2 is arranged in a vacuum container (housing 50). Laser interferometer 24 and measurement objective 9 are also located in the vacuum within housing 50. This inventive arrangement has the advantage that the measurement of the position of measurement table 20 with laser interferometer 24 is independent of variations of the ambient conditions (such as temperature, humidity and particularly air pressure). If increasingly short measurement wavelengths are used for determining the position of structures 3 on substrate 2, for example <248 nanometers, there are high transmission losses in air. These losses are negligible when the elements for measuring the position of the structures are arranged in a vacuum. A further advantage of the short wavelengths (<248 nanometers) is that these wavelengths prevent foreign deposits from forming on substrate 2 and/or measurement objective 9. With such short measurement wavelengths, these foreign deposits are generated when hydrocarbons, which are undoubtedly present in the ambient air, are cracked, or overly disturbed.

The invention has been described with reference to one embodiment. It is clear to one skilled in the art that changes and modifications may be made without departing from the scope of the following claims.

What is claimed is:

1. A coordinate measuring machine (1) for measuring structures (3) on a substrate (2) comprising a measurement table (20) movable in the X-coordinate direction and in the Y-coordinate direction, a measurement objective (9), at least one laser interferometer (24) for determining a position of the measurement table (20) or the measurement objective (9) or both, and having an illumination condenser (8) for transmitted light illumination of the substrate (2), wherein the measurement table (20), the measurement objective (9), the at least one laser interferometer (24) and the illumination condenser (8) are partially arranged in a vacuum chamber (50) provided with at least one window (52), wherein the at least one window (52) is transparent for enabling illumination and a measurement wavelength from the measurement objective (9) and the laser interferometer (24) and the illumination condenser (8) into the vacuum chamber (50).

2. The coordinate measuring machine of claim 1, wherein a lock (56) is associated with the vacuum chamber (50), via which the substrates (2) may be supplied into the vacuum chamber (50).

3. The coordinate measuring machine of claim 2, wherein in the vacuum chamber (50) and the lock (56) are connected to a vacuum system (60) having at least one vacuum pump.

4. The coordinate measuring machine of claim 1, wherein the measurement objective (9) is generally opposite from a surface (2a) of the substrate (2), and that a normal vector (30) of the surface (2a) of the substrate (2) is anti-parallel to a direction of a weight (33) of the substrate (2).

5. The coordinate measuring machine of claim 4, wherein the measurement objective (9) is opposite from the surface (2a) of the substrate (2), and that a normal vector (30) of the surface (2a) with the structures is parallel to a direction of a weight (33) of the substrate (2).

* * * * *